United States Patent [19]

Takagi et al.

[11] 3,886,003

[45] May 27, 1975

[54] METHOD OF MAKING AN INTEGRATED CIRCUIT

[75] Inventors: Mikio Takagi, Tokyo; Hajime Kamioka, Hoya; Kazufumi Nakayama; Chiaki Terada, both of Kawasaki, all of Japan

[73] Assignee: Fujitsu Limited, Japan

[22] Filed: Oct. 3, 1972

[21] Appl. No.: 294,580

[30] Foreign Application Priority Data

Oct. 4, 1971 Japan .............................. 46-77715

[52] U.S. Cl. .................. 148/187; 148/175; 357/42

[51] Int. Cl. .............................................. H01l 7/44

[58] Field of Search...................... 148/187; 317/235

[56] References Cited

UNITED STATES PATENTS

| | | | |
|---|---|---|---|
| 3,335,342 | 8/1967 | Leistiko, Jr. et al. | 317/235 |
| 3,397,326 | 8/1968 | Gallagher et al. | 317/235 X |
| 3,447,046 | 5/1969 | Cricchi et al. | 148/187 UX |
| 3,591,430 | 7/1971 | Schlegel | 148/175 |
| 3,635,773 | 1/1972 | Thine | 148/187 UX |

*Primary Examiner*—L. Dewayne Rutledge
*Assistant Examiner*—J. M. Davis
*Attorney, Agent, or Firm*—Staas & Halsey

[57] ABSTRACT

A method of making an integrated circuit including an enhancement mode and a depletion mode transistor is disclosed which employs an N-type semiconductor substrate doped with an N-type impurity of high vapor pressure such as P, As or Sb and a P-type impurity of low vapor pressure such as B or Ga at a concentration close to that of the N-type impurity. Further, the substrate of the integrated circuit is subjected to heat in a vacuum with that surface area of the substrate in which a depletion mode transistor will ultimately be formed being exposed and the remaining surface area being masked, thereby to invert the conductivity type of only the exposed surface area to P-type. The P-channel depletion mode transistor is formed in the exposed surface area and the P-channel enhancement mode transistor is formed in the unexposed surface area.

8 Claims, 11 Drawing Figures

METHOD OF MAKING AN INTEGRATED CIRCUIT

BACKGROUND OF THE INVENTION

1. Field of the Invention

This invention relates to methods of making an integrated circuit including an enhancement mode and a depletion mode transistor.

2. Description of the Prior Art

Insulated gate field effect transistors (hereinafter referred to as IGFET's) which have a metal-insulating film-semiconductor structure, are classified into N- and P-channel types according to the carrier conductivity type and are divided further into a depletion mode type which conducts at zero bias and an enhancement mode type which does not conduct at zero bias, according to the mode of operation.

In the enhancement mode IGFET, a gate bias and a drain bias are of the same polarity, so that direct interstage coupling is possible and various integrated circuits are produced. In these integrated circuits, it is profitable to employ the IGFET as a load, which is normally in the "off" state and hence presents a relatively small power loss. Using the IGFET of a depletion mode as the load, its gate and source electrodes are interconnected and the IGFET is normally in the "on" state and its switching characteristic may be improved.

Silicon dioxide formed on the surface of a silicon semiconductor has a slight tendency to make the surface of the N-type. The P-channel enhancement mode transistor is easy to produce, but the P-channel depletion mode transistor is relatively difficult to make. One method of making this depletion mode transistor is to drive boron in an N-type semiconductor substrate through a gate oxide film to form a shallow P-channel; however, an ion implantation device therefor is extremely expensive.

Another method is to induce a P-channel using as a gate insulating film, such as an alumina film, effectively having a negative charge therein; but this method necessitates the combined use of an oxide film and the alumina film and control of the amount of charge in the alumina film is difficult, so that satisfactory reproducibility is difficult to obtain.

SUMMARY OF THE INVENTION

An object of this invention is to provide a new and improved depletion mode IGFET by simpler means and, at the same time, provide a simple and practical method of making an IGFET in which enhancement and depletion mode transistors are coupled with each other to provide for enhanced switching characteristics.

According to this invention, an N-type semiconductor substrate which is doped with an N-type impurity of high vapor pressure such as P, As or Sb and a P-type impurity of low vapor pressure such as B or Ga; the substrate is subjected to heat in a vacuum with a surface area of the substrate for a depletion mode transistor being exposed and the remaining surface area being masked, thereby to invert the conductivity type of only the exposed surface area to a P-type; and a P-channel depletion mode transistor is formed in the exposed surface area and a P-channel enhancement mode transistor is formed in the other surface area.

BRIEF DESCRIPTION OF THE DRAWINGS

These and other objects and advantages of the present invention will become more apparent by referring to the following detailed description and accompanying drawings, in which.

DESCRIPTION OF THE PREFERRED EMBODIMENTS

Figure 1:
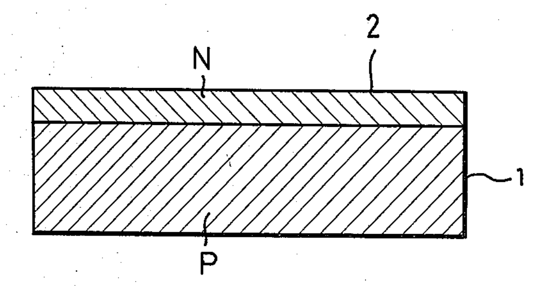
FIG. 1 is a cross-sectional view of a substrate used in an experimental example, for explaining this invention.

To facilitate a better understanding of this invention, a description will be given first of an experimental example. In this experimental example, a P-type silicon substrate 1 is shown in FIG. 1, on which there is formed by epitaxial growth an N-type silicon layer 2 containing a P-type and an N-type impurity at high concentration for resistivity control. The silicon layer 2 is formed, for example, 4.4 thick. The epitaxial growth of the silicon layer 2 is achieved by the reduction of mono-silane ($SiH_4$) and, in accordance with the present invention, selection of a dopant and control of the amount of the dopant are carried out at this stage. Namely, the N-type impurity is selected from a group of elements including P, As and Sb and its concentration is selected higher than that for providing resistivity necessary to provide a threshold voltage of an enhancement mode transistor desired to produce. At present, it is the practice to use a substrate having a resistivity (specific resistance) of 1 to 10Ωcm for the fabrication of a MOS transistor; however, in accordance with the present invention, the impurity concentration mentioned above is selected higher than that ($1.5\times10^{15}cm^{-3}$) which is required to provide the above-mentioned resistivity. The P-type impurity is selected from the group comprising B and Ga, which are both low in vapor pressure and its concentration is selected close to that of the N type impurity to make compensation substantially therefor, thus providing the N-type conductivity and the desired resistivity of 1 to 10Ωcm. In this manner, the silicon layer 2 contains the N- and P-type impurities at high concentration. Doping of the silicon layer 2 with an impurity is achieved by introducing a hydride or chloride gas of an impurity into an epitaxial growth furnace in a known manner and it is already known that the amount of doping can be controlled satisfactorily.

The substrate 1 with the silicon layer 2 formed thereon as shown in FIG. 1 is placed in a heating device, which is evacuated to a vacuum degree of $10^{-1}$ to $10^{-7}$ Torr. The heat treatment of the substrate is carried out at 1100°C for 30 minutes. In the heat treatment, the P-type impurity B or Ga in the silicon layer 2 is stable, but the N-type impurity P, As or Sb is unstable and causes out-diffusion. As a result of this, the conductivity type in the surface of the silicon layer 2 is inverted to a P-type. This P-type inversion layer can be formed deep by increasing the concentrations of both impurities and lengthening the time for heat treatment.

Figure 2:
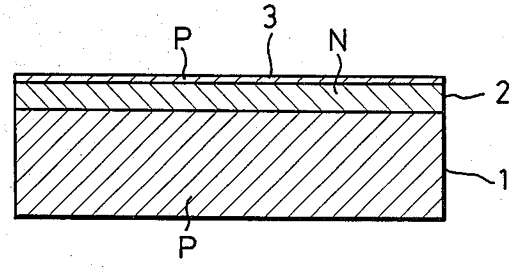
FIG. 2 is a cross-sectional view of the substrate after it is subjected to heat treatment in a vacuum.

FIG. 2 shows in cross-section the substrate after the heat treatment, the P-type inversion layer being indicated by the numeral 3.

Figure 3:
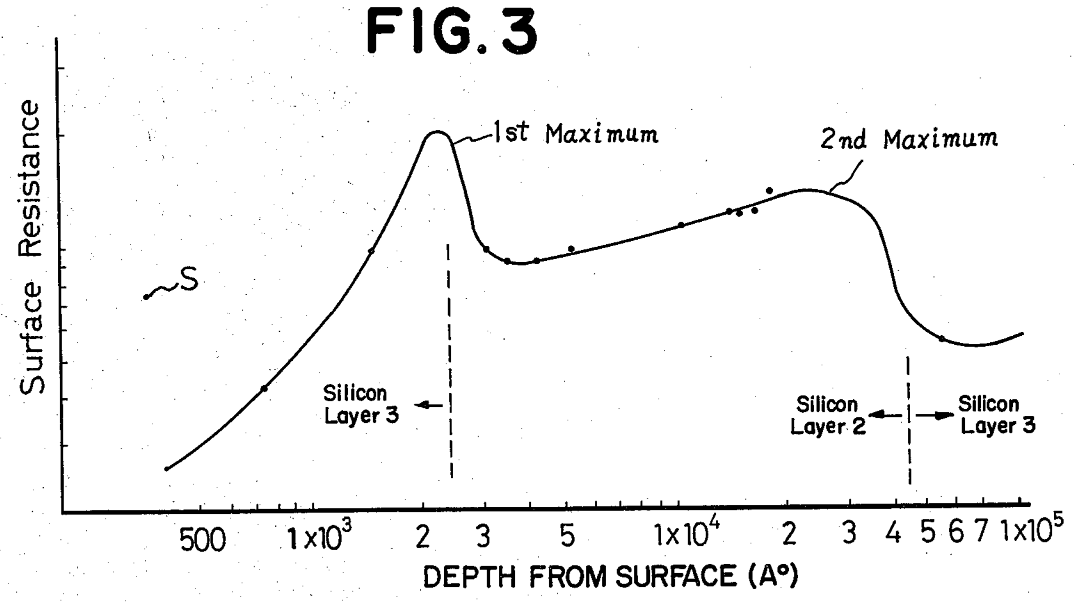
FIG. 3 is a graph showing the resistivity of the substrate of FIG. 2 at respective depths therein.

The resistivity of a substrate at respective depths therein in which the concentrations of P and B in the silicon layer 2 are selected to be $2.65\times10^{16}cm^{-3}$ and $1\times10^{17}cm^{-3}$, respectively, and which is subjected to heat treatment in a vacuum at 1100°C for 30 minutes, is shown in FIG. 3, in which the abscissa represents the depth from the surface of the silicon layer 2 and the ordinate represents the surface resistance.

The region in which the curve showing changes in the surface resistance reaches from its value at the surface of the substrate to its maximum value, is a P-type region. The measurement of the surface resistance is achieved when the substrate is etched to the respective depths and since the P-type inversion layer is made gradually thinner, the surface resistance gradually increases.

The region in which the surface resistance reaches its second maximum value after having once lowered, is an N-type region and the P-type substrate 1 underlies it.

The point S in FIG. 3 is the surface resistance value of the substrate prior to the heat treatment thereof in a vacuum and the region in which it lies is N-type. By the treatment described above, the P-type inversion layer is formed at least 2000A in thickness. Accordingly, it is possible to form a gate oxide film by thermal oxidation and, at the same time, leave one part of the P-type inversion layer.

Where thermal oxidation for the formation of the gate oxide film is carried out at a temperature lower than the 1100°C for the aforementioned heat treatment, for example, 1000°C, the P-type inversion layer remains unchanged. In the case of forming a gate oxide film 1000A at 1000°C, the time for thermal oxidation is required to be 5, 7.5 and 10 minutes, respectively, when the hot water used in vaporizing for oxidation is at 100°C, 80°C and 60°C, respectively. In the case of forming a gate oxide film 1500A thick, the time is 8, 15 and 25 minutes, respectively, with the hot water disposed at 100°C, 80°C and 60°C, respectively. It is well-known that, in the thermal oxidation of silicon, 40 to 50 percent of the thickness of the oxide film formed lies inside of the surface of silicon.

Where the P-type inversion layer is 2000A in thickness, even if a gate oxide film having a thickness of 2000A is formed, the P-type inversion layer still remains. Consequently, it is possible in accordance with the teachings of this invention to make a P-channel depletion mode IGFET using the N-type substrate and realize a high-speed integrated circuit by combining it with an enhancement mode transistor without employing an ion implantation device.

Referring now to FIGS. 4 to 11, the manufacturing process of the integrated circuit of this invention will hereinbelow be described.

Figure 4:
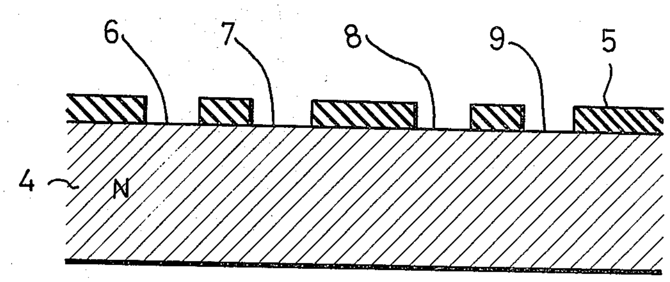
FIGS. 4 to 11, inclusive, show a sequence of steps involved in the manufacture of an integrated circuit in accordance with one example of this invention.

The manufacture begins with the preparation of an N-type silicon substrate 4, such as depicted in FIG. 4, which is doped with P and B at concentrations of $2.65\times10^{16}cm^{-3}$ and $1\times10^{17}cm^{-3}$, respectively, based on the foregoing experimental example and has a resistivity of 3Ωcm. Then, an oxide film 5 is formed about 10000A thick on the substrate 4 by means of thermal oxidation and is selectively removed by photo-etching to provide windows 6 and 7, and 8 and 9 for impurity diffusion to sources and drains of an enhancement mode and a depletion mode transistor, respectively, as depicted in FIG. 4.

Figure 5:
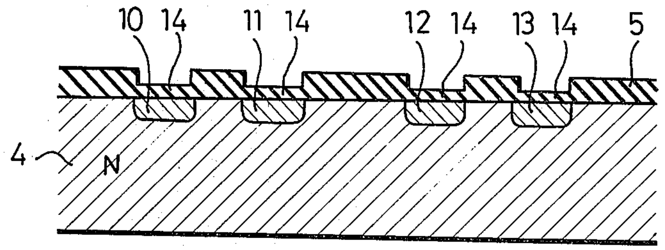

Following the formation of the windows 6, 7, 8 and 9, boron is diffused through these windows into the substrate 4 to form a source 10 and a drain 11 of the enhancement mode transistor, and a source 12 and a drain 13 of the depletion mode transistor, as shown in FIG. 5. With this diffusion treatment, oxide films 14 are formed in the respective windows as illustrated.

Figure 6:
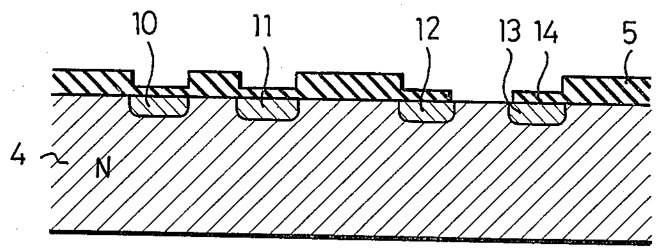
Figure 7:
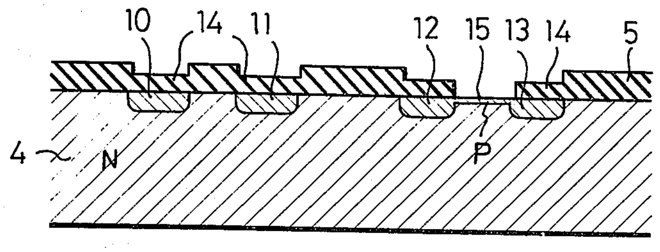

Then, the oxide films 5 and 14 between the source 12 and the drain 13 are removed as shown in FIG. 6 for heat treatment in a vacuum and the substrate 4 is subjected to the heat treatment as described above to provide a P-type inversion layer 15 as depicted in FIG. 7.

Figure 8:
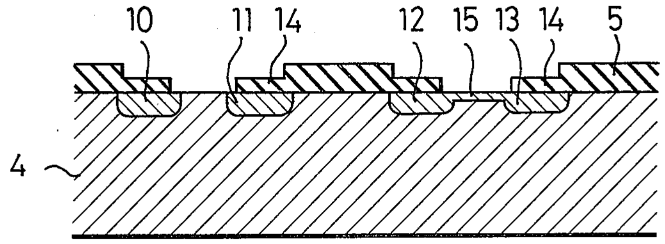
Figure 9:
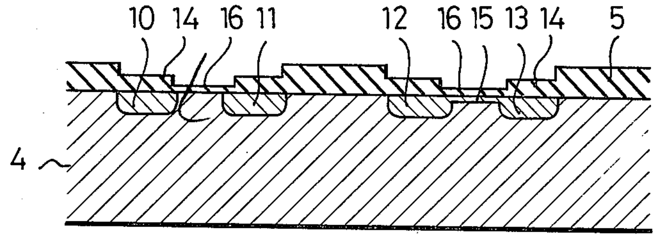

After this, the oxide films 5 and 14 between the source 10 and the drain 11 are removed as shown in FIG. 8 for the formation of a gate oxide film and thermal oxidation is achieved to form a gate oxide film 16 as illustrated in FIG. 9. In this case, the P-type inversion layer 15 between the source 12 and the drain 13 is left as it is.

Figure 10:
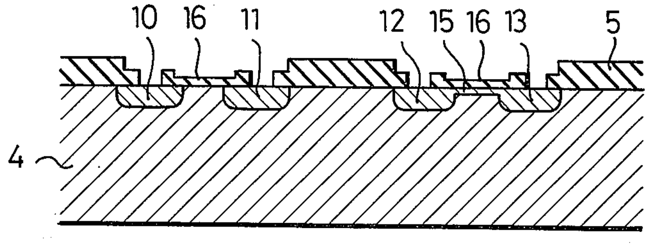

Thereafter, the oxide film 14 is selectively removed to form windows for attachment of electrodes as depicted in FIG. 10.

Figure 11:
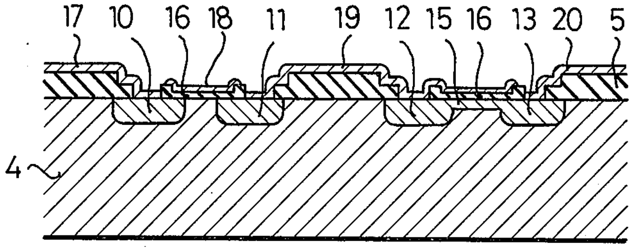

Next, a metal is vapor deposited on the exposed surfaces of the sources and drains through the windows to form electrodes as illustrated in FIG. 11 and then the assembly thus obtained is subjected to patterning.

As shown in FIG. 11, reference numeral 17 indicates a source electrode; numeral 18 refers to a gate electrode; numeral 19 identifies a common electrode; and numeral 20 indicates a drain electrode. The common electrode 19 short-circuits the drain 11 and the source 12 and, at the same time, serves as a gate electrode of the depletion mode transistor. Under normal conditions, no channel exists between the source 10 and the drain 11, but a P-channel is present between the source 12 and the drain 13 and the depletion mode transistor is normally in the "on" state. The device comprising source 10 and drain 11 is the enhancement mode transistor and the device comprising the source 12 and drain 13 is the depletion mode transistor.

When a negative signal pulse is impressed to the gate electrode 18, the enhancment mode transistor conducts and, in this case, a switching operation is carried out at a speed higher than that when the enhancement mode transistor is used as a load.

While the present invention has been described in connection with its specific examples, it is needless to say that various modifications may be effected. Namely, in the foregoing example, heat treatment in a vacuum is achieved after the formation of the sources and the drains, but the former process may be effected prior to the latter. Further, it is also possible to use one region in common to the drain 11 and the source 12 so as to provide for enhanced degree of integration. Of course, the combination of the P- and N-type impurities in the substrate 4 may be selected as desired.

What is claimed is:

1. A method of manufacturing a depletion mode insulated gate field effect transistor and an enhancement mode insulated gate field effect transistor as an integrated semiconductor assembly comprising the steps of:

a. providing a semiconductor substrate of one conductivity type doped with an impurity of said one conductivity type having a relatively high vapor pressure and with an impurity of an opposite conductivity type having a relatively low vapor pressure and a concentration approximating that of said impurity of said one conductivity type;

b. diffusing an impurity of said opposite conductivity type into selected portions of the surface of said semiconductor substrate to form source and drain regions for both an enhancement mode transistor and a depletion mode transistor;

c. masking a selected area of said semiconductor surface so as to expose only that surface area of said semiconductor substrate intermediate the source and drain for said depletion type transistor, and d. heating said semiconductor substrate at a selected temperature in a vacuum to invert the region of said substrate within said intermediate surface area from said one conductivity type to said opposite conductivity type thereby interconnecting the source and drain of said depletion mode transistor with said inverted region.

2. The method of manufacturing an integrated semiconductor assembly as claimed in claim 1, wherein said impurity of said one conductivity type is selected from a group consisting of P, As and Sb, and wherein said impurity of said opposite conductivity type is selected of a group consisting of B and Ga.

3. The method of manufacturing an integrated semiconductor assembly as claimed in claim 1, wherein said step of forming said source and drain regions includes the steps of forming a first masking layer upon said surface of said semiconductor substrate and selectively removing portions thereof to form windows corresponding to said source and drain regions of said enhancement mode and depletion mode transistors, and introducing as by diffusing through said windows said impurity of said opposite conductivity type into said semiconductor substrate to form said source and drain regions of said enhancement mode and depletion mode transistors, while forming a second masking layer within said windows.

4. A method of manufacturing an integrated semiconductor assembly as claimed in claim 3, including the steps of removing a portion of the first masking layer corresponding to said gate region of said depletion mode transistor to form a window for the inversion of said substrate region within said intermediate surface area.

5. A method of manufacturing an integrated semiconductor assembly as claimed in claim 1, wherein said enhancement mode transistor includes an intermediate portion between said source and drain regions and there is included the further steps of forming first and second insulating layers upon said intermediate portions of said enhancement mode and said depletion mode transistors, and thereafter forming electrical contacts directly to said source and drain regions and to said first and second insulating layers of said enhancement mode and depletion mode transistors.

6. The method of manufacturing an integrated semiconductor assembly as claimed in claim 5, including the steps of forming an electrical connection between said drain region of said enhancement mode transistor and said source region of said depletion mode transistor.

7. The method of manufacturing an integrated semiconductor assembly as claimed in claim 1, wherein said one conductivity type is an N-type and said opposite conductivity type is a P-type, and P-channel depletion mode and enhancement mode transistors are formed thereby.

8. The method of manufacturing an integrated semiconductor assembly as claimed in claim 1, including the steps of forming a gate insulator on the surface areas of said substrate intermediate each source and drain and forming a gate electrode on said gate insulators.

* * * * *

UNITED STATES PATENT OFFICE
CERTIFICATE OF CORRECTION

Patent No. 3,886,003 Dated May 27, 1975

Inventor(s) Mikio Takagi, Hajime Kamioka, Kazufumi Nakayama, Chiaki Terada

It is certified that error appears in the above-identified patent and that said Letters Patent are hereby corrected as shown below:

Column 2, line 22, after "4.4" insert --/u--.

Signed and Sealed this

*sixteenth* Day of *September 1975*

[SEAL]

*Attest:*

RUTH C. MASON
*Attesting Officer*

C. MARSHALL DANN
*Commissioner of Patents and Trademarks*